US012690456B2

(12) United States Patent
Kim et al.

(10) Patent No.: US 12,690,456 B2
(45) Date of Patent: Jul. 21, 2026

(54) DOUBLE-SIDED HEAT DISSIPATION POWER SEMICONDUCTOR MODULE AND METHOD OF MANUFACTURING THE SAME

(71) Applicant: LX Semicon Co., Ltd., Daejeon (KR)

(72) Inventors: Tae Ryong Kim, Daejeon (KR); Deog Soo Kim, Daejeon (KR)

(73) Assignee: LX SEMICON CO., LTD, Daejeon (KR)

( * ) Notice: Subject to any disclaimer, the term of this patent is extended or adjusted under 35 U.S.C. 154(b) by 758 days.

(21) Appl. No.: 18/080,621

(22) Filed: Dec. 13, 2022

(65) Prior Publication Data

US 2023/0197557 A1 Jun. 22, 2023

(30) Foreign Application Priority Data

Dec. 17, 2021 (KR) ........................ 10-2021-0181975

(51) Int. Cl.
| | |
|---|---|
| *H10W 40/25* | (2026.01) |
| *H10W 74/01* | (2026.01) |
| *H10W 74/10* | (2026.01) |
| *H10W 74/47* | (2026.01) |
| *H10W 90/00* | (2026.01) |
| *H10W 70/09* | (2026.01) |

(Continued)

(52) U.S. Cl.
CPC ....... *H10W 40/255* (2026.01); *H10W 74/016* (2026.01); *H10W 74/121* (2026.01); *H10W 74/47* (2026.01); *H10W 90/401* (2026.01); *H10W 70/09* (2026.01); *H10W 70/60* (2026.01); *H10W 90/00* (2026.01); *H10W 90/10* (2026.01)

(58) Field of Classification Search
CPC . H01L 23/3735; H01L 21/565; H01L 23/293; H01L 23/3135; H01L 23/49833; H01L 24/19; H01L 24/20; H01L 24/24; H01L 2224/19; H01L 2224/215; H01L 2224/2405; H01L 2224/24137; H01L 2224/24175; H01L 2924/1203; H01L 2924/13055; H01L 2924/13091
See application file for complete search history.

(56) References Cited

U.S. PATENT DOCUMENTS

| | | | |
|---|---|---|---|
| 7,514,636 | B2 | 4/2009 | Sasaki |
| 10,079,155 | B2 | 9/2018 | Nakajima et al. |
| 10,964,618 | B2 | 3/2021 | Lee et al. |

(Continued)

FOREIGN PATENT DOCUMENTS

| | | |
|---|---|---|
| JP | 2006-165175 A | 6/2006 |
| JP | 2013-065620 A | 4/2013 |

(Continued)

OTHER PUBLICATIONS

Korean Office Action dated Sep. 9, 2025 issued in Patent Application No. 10-2021-0181975 (6 pages).

*Primary Examiner* — Samuel A Gebremariam
(74) *Attorney, Agent, or Firm* — POLSINELLI PC

(57) ABSTRACT

The present disclosure relates to a power semiconductor module of which heat is dissipated by its both sides and provides a power semiconductor module technology in which a mold is formed in a surrounding space of a power semiconductor die, and then, wires are formed on upper and lower sides of the power semiconductor die and substrates are disposed on upper and lower sides of the wires.

18 Claims, 18 Drawing Sheets

(51) Int. Cl.
  *H10W 70/60*   (2026.01)
  *H10W 90/10*   (2026.01)

(56)      References Cited

U.S. PATENT DOCUMENTS

| | | | | |
|---|---|---|---|---|
| 2007/0181908 A1* | 8/2007 | Otremba | ................. | H01L 24/49 |
| | | | | 257/107 |
| 2013/0020694 A1* | 1/2013 | Liang | .................... | H01L 23/473 |
| | | | | 257/691 |
| 2021/0358876 A1* | 11/2021 | Tzu | .................... | H01L 23/4334 |

FOREIGN PATENT DOCUMENTS

| | | | |
|---|---|---|---|
| JP | 2017-041514 A | 2/2017 |
| KR | 20130139011 A | 12/2013 |
| KR | 10-2017-0069322 A | 6/2017 |
| KR | 20210070928 A | 6/2021 |

* cited by examiner

100

200

S500

S600

S700

S800

S900

DOUBLE-SIDED HEAT DISSIPATION POWER SEMICONDUCTOR MODULE AND METHOD OF MANUFACTURING THE SAME

CROSS REFERENCE TO RELATED APPLICATION

This application claims priority to Republic of Korea Patent Application No. 10-2021-0181975 filed on Dec. 17, 2021, which is hereby incorporated by reference in its entirety.

BACKGROUND

1. Field of Technology

The present disclosure relates to a power semiconductor module and, more particularly, to a power semiconductor module the heat of which is dissipated to both sides thereof.

2. Related Technology

A semiconductor that is used in a device for processing high power, such as a converter or an inverter, is called a power semiconductor. The power semiconductor may be an insulated gate bipolar transistor (IGBT), a metal oxide semiconductor field effect transistor (MOSFET), or a diode, for example, and may have characteristics in that internal pressure is great and a high current may flow.

The power semiconductor may have a great switching loss and/or a great conduction loss due to high internal pressure and a high current. If a loss is great in the power semiconductor, the amount of heat dissipated is increased. The power semiconductor may have the great amount of heat dissipated due to the switching loss and/or the conduction loss.

If the amount of heat dissipated is not controlled to a proper level, the physical properties of a device may be changed, and the power semiconductor may not perform its own function. In order to prevent such problems, heat dissipation means may be added to the power semiconductor. A power semiconductor module may include at least power semiconductor within one package, and may have a proper heat dissipation form.

The power semiconductor module may be divided into a form in which the heat of the power semiconductor module is dissipated to one side thereof and a form in which the heat of the power semiconductor module is dissipated to both sides thereof.

The power semiconductor module the heat of which is dissipated to both sides thereof has been known to be advantageous in terms of heat dissipation because heat can be discharged to both upper and lower sides of a power semiconductor die. However, such a double-sided heat dissipation power semiconductor module has been known to have a miss-alignment problem between components, a flatness problem attributable to a height deviation between components, a low yield problem attributable to an adhesion failure between an upper substrate and a lower substrate, a low reliability problem according to forms and materials of components, etc.

The discussions in this section are only to provide background information and does not constitute an admission of prior art.

SUMMARY

In such a background, the present disclosure is intended to provide a technology capable of solving the aforementioned problems of a double-sided heat dissipation power semiconductor module.

In an aspect, the present disclosure provides a power semiconductor module, including a semiconductor die layer in which a first power semiconductor die and a second power semiconductor die are disposed and a first mold is formed to surround lateral sides of the first power semiconductor die and the second power semiconductor die, a wiring layer including first wires disposed on one side of the semiconductor die layer and second wires disposed on the other side of the semiconductor die layer, a substrate layer configured to dissipate heat that is delivered from the semiconductor die layer to the wiring layer, and a second mold configured to fill a surrounding space of the wiring layer.

In another aspect, the present disclosure provides a power semiconductor module, including a semiconductor die layer in which a first power semiconductor die and a second power semiconductor die are disposed and a first mold is formed to surround sides of the first power semiconductor die and the second power semiconductor die, a wiring layer including first wires disposed on one side of the semiconductor die layer and second wires disposed on the other side of the semiconductor die layer, wherein one of the first wires and one of the second wires are electrically connected through a connection wire that penetrates the first mold, and a substrate layer configured to dissipate heat that is delivered from the semiconductor die layer to the wiring layer.

In still another aspect, the present disclosure provides a method of manufacturing a power semiconductor module, the method, including disposing a first power semiconductor die and a second power semiconductor die, forming a first mold configured to expose upper and lower sides of the first power semiconductor die and the second power semiconductor die and to surround lateral sides of the first power semiconductor die and the second power semiconductor die, forming first wires on an upper side of a semiconductor die layer including the first power semiconductor die, the second power semiconductor die, and the first mold, forming second wires on a lower side of the semiconductor die layer, disposing, on an upper side of the first wires, a first substrate configured to upwardly dissipate heat, and disposing, on a lower side of the second wires, a second substrate configured to downwardly dissipate heat.

As described above, according to the present embodiment, a miss-alignment problem between components in the double-sided heat dissipation power semiconductor module can be improved. A flatness problem attributable to height differences between components can be improved. An adhesion failure problem between an upper substrate and a lower substrate can be improved. A low reliability problem according to forms and materials of components can be improved. Furthermore, according to the present embodiment, reliability can be enhanced because the number of junctions of heterogeneous components is reduced, and a general thickness of the power semiconductor module can be reduced because a spacer is removed. Furthermore, according to the present embodiment, material and process costs can be reduced by removing a spacer.

DETAILED DESCRIPTION OF EMBODIMENTS

Figure 1:
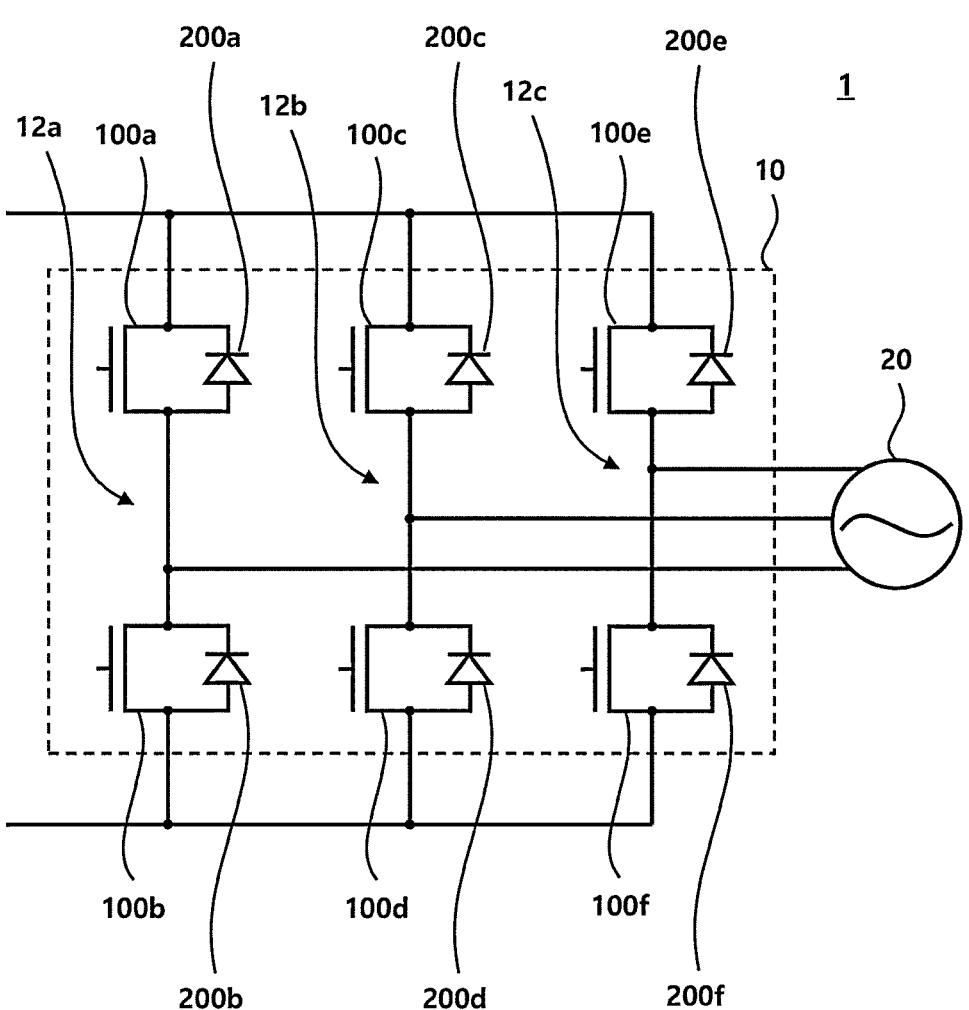
FIG. 1 is a construction diagram of a power device according to an embodiment.

FIG. 1 is a construction diagram of a power device according to an embodiment.

Referring to FIG. 1, the power device 1 may include an inverter 10 and a motor 20.

The motor 20 may provide power to an electric vehicle or a fuel cell vehicle. The motor 20 may be driven by being supplied with three-phase alternating current (AC) power.

The inverter 10 may supply the AC power to the motor 20. The inverter 10 may receive direct current (DC) power from a battery or a fuel cell, and may convert the DC power into the AC power. Furthermore, the inverter 10 may output the AC power to the motor 20.

The inverter 10 may include a plurality of power semiconductors 100a to 100f and 200a to 200f, and may convert the DC power into the AC power through on-off control over the plurality of power semiconductors 100a to 100f and 200a to 200f. For example, the inverter 10 may supply a positive voltage to the motor 20 by making on the first power semiconductor 100a and off the second power semiconductor 100b in a first time interval of one cycle, and may supply a negative voltage to the motor 20 by making off the first power semiconductor 100a and on the second power semiconductor 100b in a second time interval of the one cycle.

A group of power semiconductors that are disposed in series in a high voltage line and low voltage line on an input side thereof is called an arm. For example, a first power semiconductor 100a and a second power semiconductor 100b may constitute a first arm 12a, a third power semiconductor 100c and a fourth power semiconductor 100d may constitute a second arm 12b, and a fifth power semiconductor 100e and a sixth power semiconductor 100f may constitute a third arm 12c.

In the arm, an upper power semiconductor and a lower power semiconductor may be controlled so that they do not become simultaneously on. For example, in the first arm 12a, the first power semiconductor 100a and the second power semiconductor 100b may alternately become on and off without becoming simultaneously on.

Each of the power semiconductors 100a to 100f and 200a to 200f may be applied with a high voltage in the state in which each of the power semiconductors 100a to 100f and 200a to 200f has become off. For example, if the second power semiconductor 100b becomes off in the state in which the first power semiconductor 100a has become on, an input voltage may be applied to the second power semiconductor 100b without change. The input voltage may be a relatively high voltage. Internal pressure of each of the power semiconductors 100a to 100f and 200a to 200f may be designed to a high level so that each of the power semiconductors 100a to 100f and 200a to 200f can withstand such a high voltage.

Each of the power semiconductors 100a to 100f and 200a to 200f may conduct a high current in the state in which each of the power semiconductors 100a to 100f and 200a to 200f has been on. The motor 20 is driven at a relatively high current. Such a high current may be supplied to the motor 20 through a power semiconductor that has become on.

A high voltage that is applied to each of the power semiconductors 100a to 100f and 200a to 200f may cause a high switching loss. A high current that passes through the power semiconductors 100a to 100f and 200a to 200f may cause a high conduction loss. In order to discharge heat generated due such a loss, the power semiconductors 100a to 100f and 200a to 200f may be packaged as a power semiconductor module including heat dissipation means.

All the power semiconductors 100a to 100f and 200a to 200f that are included in the inverter 10 may be packaged as one power semiconductor module.

For example, the first power semiconductor 100a, the second power semiconductor 100b, the third power semiconductor 100c, the fourth power semiconductor 100d, the fifth power semiconductor 100e, and the sixth power semiconductor 100f may be packaged as one power semiconductor module. In order to increase the current capacity, an additional power semiconductor that is disposed in parallel to each of the power semiconductors 100a to 100f and 200a to 200f may be further present. In such a case, the number of power semiconductors that are included in the power semiconductor module may be more than 6. The inverter 10 may include the power semiconductors 200a to 200f having a diode form, in addition to the power semiconductors 100a to 100f having a transistor form. For example, a first diode 200a may be further disposed in parallel to the first power semiconductor 100a. A second diode 200b may be disposed in parallel to the second power semiconductor 100b. Furthermore, such diodes 200a to 200f may be packaged along with one power semiconductor module.

Power semiconductors that constitute each arm may be packaged as one power semiconductor module.

For example, the first power semiconductor 100a and the second power semiconductor 100b that constitute the first arm 12a may be packaged as one power semiconductor module. The third power semiconductor 100c and the fourth power semiconductor 100d that constitute the second arm 12b may be packaged as another power semiconductor module. The fifth power semiconductor 100e and the sixth power semiconductor 100f that constitute the third arm 12c may be packaged as still another power semiconductor module. In order to increase the current capacity, an additional power semiconductor that is disposed in parallel to each of the power semiconductors 100a to 100f may be further present. In such a case, the number of power semiconductors that are included in the power semiconductor module may be more than 2. Furthermore, each arm may further include the power semiconductors 200a to 200f having a diode form, in addition to the power semiconductors 100a to 100f having a transistor form. Such diodes 200a to 200f may also be packaged along with one power semiconductor module.

Each of the power semiconductors 100a to 100f may be packaged as one power semiconductor module.

For example, the first power semiconductor 100a may be packaged as one power semiconductor module, the second power semiconductor 100b may be packaged as another power semiconductor module, and the third power semiconductor 100c may be packaged as still another power semiconductor module. In order to increase the current capacity, an additional power semiconductor that is disposed in parallel to each of the power semiconductors 100a to 100f may be further present. In such a case, the number of power semiconductors that are included in the power semiconductor module may be two or more. Furthermore, a diode may additionally further included in each power semiconductor module.

A power semiconductor that is fabricated through a wafer level process may be called a power semiconductor die. If a power semiconductor has a transistor form, the power semiconductor die may be implemented in the form of an insulated gate bipolar transistor (IGBT) form, and may be implemented in the form of a metal oxide semiconductor field effect transistor (MOSFET). The power semiconductor die may have a diode form. In an embodiment described hereinafter, a power semiconductor die may have a transistor form and have a diode form.

Figures 2, 3:
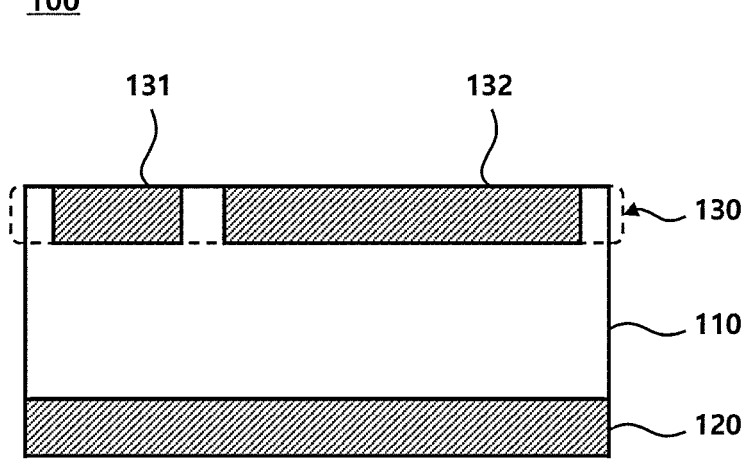
FIG. 2 is a cross-sectional diagram of a first example of a power semiconductor die according to an embodiment.
FIG. 3 is a cross-sectional diagram of a second example of a power semiconductor die according to an embodiment.

FIG. 2 is a cross-sectional diagram of a first example of a power semiconductor die according to an embodiment.

Referring to FIG. 2, a power semiconductor die 100 may have a transistor form, and may include a first electrode 130 and a second electrode 120.

The first electrode 130 may be disposed on one side of a semiconductor layer 110. For example, the first electrode 130 may be disposed above the semiconductor layer 110 on the basis of FIG. 2. Furthermore, the second electrode 120 may be disposed on the other side of the semiconductor layer 110. For example, the second electrode 120 may be disposed below the semiconductor layer 110 on the basis of FIG. 2.

In the form of the MOSFET, the first electrode 130 may include a gate electrode 131 and a source electrode 132, and the second electrode 120 may include a drain electrode. In the form of the IGBT, the first electrode 130 may include a gate electrode 131 and an emitter electrode 132, and the second electrode 120 may include a collector electrode.

The first electrode 130 may be formed of an Al-based metal. The second electrode 120 may be formed of a Ti/Ni/Ag metal, a NiV/Ag metal or a vanadium (V)/Ni/Ag metal including a Ti layer, a Ni layer, or an Ag layer.

The semiconductor layer 110 may be formed of silicon carbide (SiC).

FIG. 3 is a cross-sectional diagram of a second example of a power semiconductor die according to an embodiment.

Referring to FIG. 3, a power semiconductor die 200 may have a diode form, and may include a first electrode 230 and a second electrode 220.

The first electrode 230 may be disposed on one side of a semiconductor layer 210. For example, the first electrode 230 may be disposed above the semiconductor layer 210 on the basis of FIG. 3. Furthermore, the second electrode 220 may be disposed on the other side of the semiconductor layer 210. For example, the second electrode 220 may be disposed below the semiconductor layer 210 on the basis of FIG. 3.

In the form of a diode, the first electrode 230 may include anode electrode, and the second electrode 220 may include a cathode electrode. The semiconductor layer 210 may include a drift region, and may be formed of silicon carbide (SiC).

Figure 4:
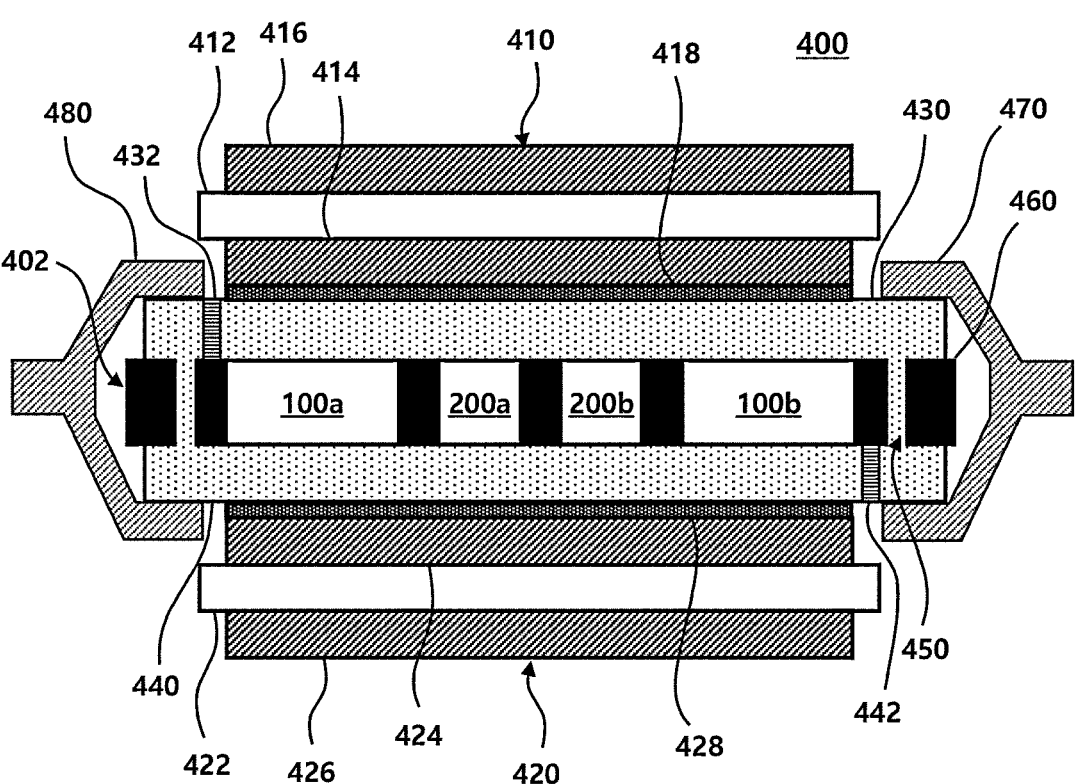
FIG. 4 is a cross-sectional diagram of a power semiconductor module according to an embodiment.

FIG. 4 is a cross-sectional diagram of a power semiconductor module according to an embodiment.

Referring to FIG. 4, the power semiconductor module 400 may include a semiconductor die layer 402, a wiring layer 430 and 440, a substrate layer 410 and 420, a lead frame 470 and 480, etc.

A plurality of power semiconductors dies 100a, 100b, 200a, and 200b may be disposed in the semiconductor die layer 402. For example, a first power semiconductor die 100a, a second power semiconductor die 100b, a third power semiconductor die 200a, and a fourth power semiconductor die 200b may be disposed in the semiconductor die layer 402. The first power semiconductor die 100a and the second power semiconductor die 100b may be power semiconductor dies having a transistor form, such as an MOSFET. The third power semiconductor die 200a and the fourth power semiconductor die 200b may be power semiconductor dies having a diode form.

The first power semiconductor die 100a and the second power semiconductor die 100b may have the electrodes disposed in the same direction. For example, the source electrode and gate electrode of the first power semiconductor die 100a may be disposed on the upper side thereof, and the drain electrode of the first power semiconductor die 100a may be disposed at the bottom thereof. Furthermore, the source electrode and gate electrode of the second power semiconductor die 100b may be disposed on the uppers side thereof, and the drain electrode of the second power semiconductor die 100b may be disposed at the bottom thereof. In such an arrangement structure, the first power semiconductor die 100a and the second power semiconductor die 100b may be electrically connected in parallel.

The first power semiconductor die 100a and the second power semiconductor die 100b may have the electrodes disposed in opposite directions. For example, the source electrode and gate electrode of the first power semiconductor die 100a may be disposed on the uppers side thereof, and the drain electrode of the first power semiconductor die 100a may be disposed at the bottom thereof. Furthermore, the source electrode and gate electrode of the second power semiconductor die 100b may be disposed at the bottom thereof, and the drain electrode of the second power semiconductor die 100b may be disposed on the uppers side thereof. In such an arrangement structure, the first power semiconductor die 100a and the second power semiconductor die 100b may constitute one arm.

The third power semiconductor die 200a and the fourth power semiconductor die 200b may have the electrodes disposed in the same direction. For example, the anode electrode of the third power semiconductor die 200a may be disposed at the bottom thereof, and the cathode electrode of the third power semiconductor die 200a may be disposed on the uppers side thereof. Furthermore, the anode electrode of the fourth power semiconductor die 200b may be disposed at the bottom thereof, and the cathode electrode of the fourth power semiconductor die 200b may be disposed on the uppers side thereof. In such an arrangement structure, the third power semiconductor die 200a and the fourth power semiconductor die 200b may be electrically connected in parallel.

The third power semiconductor die 200a and the fourth power semiconductor die 200b may have the electrodes disposed in opposite directions. For example, the anode electrode of the third power semiconductor die 200a may be disposed at the bottom thereof, and the cathode electrode of the third power semiconductor die 200a may be disposed on the uppers side thereof. Furthermore, the anode electrode of the fourth power semiconductor die 200b may be disposed on the uppers side thereof, and the cathode electrode of the fourth power semiconductor die 200b may be disposed at the bottom thereof. In such an arrangement structure, the third power semiconductor die 200a and the fourth power semiconductor die 200b may constitute one arm.

A first mold 460 that surrounds the sides of the plurality of power semiconductors dies 100a, 100b, 200a, and 200b may be formed in the semiconductor die layer 402.

The first mold 460 may not be disposed on the upper sides and lower sides of the plurality of power semiconductors dies 100a, 100b, 200a, and 200b, and may be disposed on only the sides of the plurality of power semiconductors dies 100*a*, 100*b*, 200*a*, and 200*b*. The thickness of the first mode 460 may be less than the thickness of each of the plurality of power semiconductor dies 100*a*, 100*b*, 200*a*, and 200*b*.

The first mold 460 may be formed of an epoxy molding compound (EMC), and may perform a function for protecting the plurality of power semiconductors dies 100*a*, 100*b*, 200*a*, and 200*b* against oxidizing substances and fixing the plurality of power semiconductors dies 100*a*, 100*b*, 200*a*, and 200*b*.

The electrodes of the plurality of power semiconductors dies 100*a*, 100*b*, 200*a*, and 200*b* may be exposed in an upward direction and a downward direction of the semiconductor die layer 402. Furthermore, such electrodes may be electrically connected to wires that are disposed in the wiring layer 430 and 440.

The wiring layer 430, 440 may include a first wiring layer 430 that is disposed above the semiconductor die layer 402 and a second wiring layer 440 that is disposed below the semiconductor die layer 402.

First wires may be disposed in the first wiring layer 430. The first wires may electrically connect electrodes that are upwardly exposed among the electrodes of the plurality of power semiconductors dies 100*a*, 100*b*, 200*a*, and 200*b*. For example, one of the first wires may electrically connect a first electrode of the first power semiconductor die 100*a* and a second electrode of the third power semiconductor die 200*a*. The first wires may electrically connect some electrodes that are upwardly exposed, among the electrodes of the plurality of power semiconductors dies 100*a*, 100*b*, 200*a*, and 200*b*, and the lead frame 470 and 480. For example, another wire of the first wires may electrically connect the first electrode of the first power semiconductor die 100*a* and the first lead frame 470.

The first wires may be formed of a Cu-based metal. Furthermore, wires that are insulated from each other among the first wires may be physically separated from each other by a first insulating member 432. The first insulating member 432 may be constituted with a photoresist, for example.

Second wires may be disposed in the second wiring layer 440. The second wires may electrically connect electrodes that are downwardly exposed among the electrodes of the plurality of power semiconductors dies 100*a*, 100*b*, 200*a*, and 200*b*. For example, one of the second wires may electrically connect a second electrode of the first power semiconductor die 100*a* and a first electrode of the third power semiconductor die 200*a*. The second wires may electrically connect some electrodes that are downwardly exposed, among the electrodes of the plurality of power semiconductors dies 100*a*, 100*b*, 200*a*, and 200*b*, and the lead frame 470 and 480. For example, another wire of the second wires may electrically connect the second electrode of the first power semiconductor die 100*a* and the second lead frame 480.

The second wires may be formed of a Cu-based metal. Furthermore, wires that are insulated from each other, among the second wires, may be physically separated from each other by a second insulating member 442. The second insulating member 442 may be constituted with a photoresist, for example.

One of the first wires of the first wiring layer 430 and one of the second wires of the second wiring layer 440 may be electrically connected through a connection wire 450 that penetrates the first mold 460. A through hole may be formed in the first mold 460. The connection wire 450 may be disposed in the through hole. Furthermore, the connection wire 450 may be connected to one of the first wires on the uppers side thereof and to one of the second wires at the bottom thereof, and may electrically connect the two wires.

The lead frame 470 and 480 may have one side come into contact with the wiring layer 430 and 440 and have the other side provided to an external connection terminal. The external connection terminal may be electrically connected to a motor, input power, or an inverter controller, for example. The wiring layer 430, 440 may be longer than the substrate layer 410, 420 from the side view. By such a difference in their lengths, a partial area of the wiring layer 430, 440 may not overlap with the substrate layer 410, 420 and the lead frame 470, 480 may be connected to this partial area.

The lead frame 470 and 480 may come into contact with both the upper and the lower sides of the wiring layer 430 and 440. The lead frame 470 and 480 may come into contact with wires that are electrically connected to the connection wire 450 on the upper and the lower sides thereof.

The lead frame 470 and 480 may come into contact with the upper and the lower sides of the wiring layer 430 and 440 while pressing the upper side and the lower side by an elastic force. For example, the lead frame 470 and 480 may have one side constructed in the form of a clip. The lead frame 470 and 480 may form the elastic force through the form of the clip. Accordingly, the lead frame 470 and 480 may come into contact with the upper and the lower sides of the wiring layer 430 and 440 while pressing the upper side and the lower side by the elastic force.

The lead frame 470 and 480 may be divided into the first lead frame 470 and the second lead frame 480. The first lead frame 470 and the second lead frame 480 may be electrically separated from each other, and may be connected to different electrodes of the plurality of power semiconductors dies 100*a*, 100*b*, 200*a*, and 200*b*.

A surrounding space of the wiring layer 430 and 440 may be filled with a second mold (not illustrated). For example, the second mold may be filled into a space between the wiring layer 430 and 440 and the substrate layer 410 and 420, and may be filled to surround a part that belongs to the wiring layer 430 and 440 and that is not surrounded by the substrate layer 410 and 420. Furthermore, the second mold may be filled to surround a contact part of the lead frame 470 and 480 and the first wires and a contact part of the second wires thereof. According to such an arrangement of the second mold, one side of the lead frame 470 and 480 may come into contact with the wiring layer 430 and 440 inside the second mold, and the other side thereof may be exposed to the outside of the second mold.

The second mold may be formed of the same substance as the first mold 460. For example, the second mold and the first mold 460 may be formed of an EMC. The first mold 460 and the second mold may be formed at different times. For example, the first mold 460 may be first formed, and the second mold may be then formed. Depending on embodiments, the second mold may have properties different from those of the first mold 460. For example, the second mold may have a different thermal conductivity than the first mode 460. Here, the second mold and the first mold 460 may have different thermal conductivity even though both are formed of an EMC. In addition, depending on embodiments, the second mold and the first mold 460 may respectively be formed of different materials.

The substrate layer 410 and 420 may be divided into a first substrate 410 and a second substrate 420.

The first substrate 410 may be disposed above the first wiring layer 430. The first substrate 410 may be bonded to the first wiring layer 430 through a first bonding member 418. The first bonding member 418 may be an Sn—Ag-based bonding member or an Ag-based bonding member, for example. The first substrate 410 may be bonded to the first wiring layer 430 through soldering or sintering.

The second substrate 420 may be disposed below the second wiring layer 440. The second substrate 420 may be bonded to the second wiring layer 440 through a second bonding member 428. The second bonding member 428 may be an Sn—Ag-based bonding member or an Ag-based bonding member, for example. The second substrate 420 may be bonded to the second wiring layer 440 through soldering or sintering.

The substrate layer 410 and 420 may discharge heat that is delivered from the semiconductor die layer 402 to the wiring layer 430 and 440, while supporting the wiring layer 430 and 440. For example, the first substrate 410 may upward discharge heat that is delivered to the first wiring layer 430. Furthermore, the second substrate 420 may downward discharge heat that is delivered to the second wiring layer 440.

The first substrate 410 may include a first insulating substance layer 412, a first metal wiring layer 414, and a first heat dissipation metal layer 416.

The first insulating substance layer 412 may electrically insulate the first metal wiring layer 414 and the first heat dissipation metal layer 416. The first insulating substance layer 412 may be formed of a ceramic material having thermal conductivity.

The first heat dissipation metal layer 416 may have one side come into contact with the first insulating substance layer 412, and may dissipate heat to the other side thereof. Heat dissipation means including a cooling medium may be closely disposed on the other side of the first heat dissipation metal layer 416.

Metal wiring may be disposed in the first metal wiring layer 414. The metal wiring may be electrically connected to the first wiring layer 430, and may be electrically connected to electrodes of the plurality of power semiconductors dies 100*a*, 100*b*, 200*a*, and 200*b*.

The first metal wiring layer 414 and the first heat dissipation metal layer 416 may be formed of a Cu-based metal. From an aspect that the Cu-based metal has been attached, a substrate such as the first substrate 410 is also called a direct bonded copper (DBC) substrate or an active brazing metal (AMB) substrate.

The second substrate 420 may include a second insulating substance layer 422, a second metal wiring layer 424, and a second heat dissipation metal layer 426.

The second insulating substance layer 422 may electrically insulate the second metal wiring layer 424 and the second heat dissipation metal layer 426. The second insulating substance layer 422 may be formed of a ceramic material having thermal conductivity.

The second heat dissipation metal layer 426 may have one side come into contact with the second insulating substance layer 422, and may dissipate heat to the other side thereof. Heat dissipation means including a cooling medium may be closely disposed on the other side of the second heat dissipation metal layer 426.

Metal wiring may be disposed in the second metal wiring layer 424. The metal wiring may be electrically connected to the second wiring layer 440, and may be electrically connected to electrodes of the plurality of power semiconductors dies 100*a*, 100*b*, 200*a*, and 200*b*.

The second metal wiring layer 424 and the second heat dissipation metal layer 426 may be formed of a Cu-based metal. From an aspect that the Cu-based metal has been attached, a substrate such as the second substrate 420 is also called a direct bonded copper (DBC) substrate or an active brazing metal (AMB) substrate.

Hereinafter, a method of manufacturing a power semiconductor module according to an embodiment is described.

FIGS. 5A to 12 are exemplary diagrams illustrating processes of a method of manufacturing a power semiconductor module according to an embodiment. FIGS. 5A, 6A, 7A, 8A, 9A, and 10A are plan views of the power semiconductor module. FIGS. 5B, 6B, 7B, 8B, 9B, 10B, 11, and 12 are cross-sectional diagrams taken along line X-X' in the respective plan views.

Figure 5A:
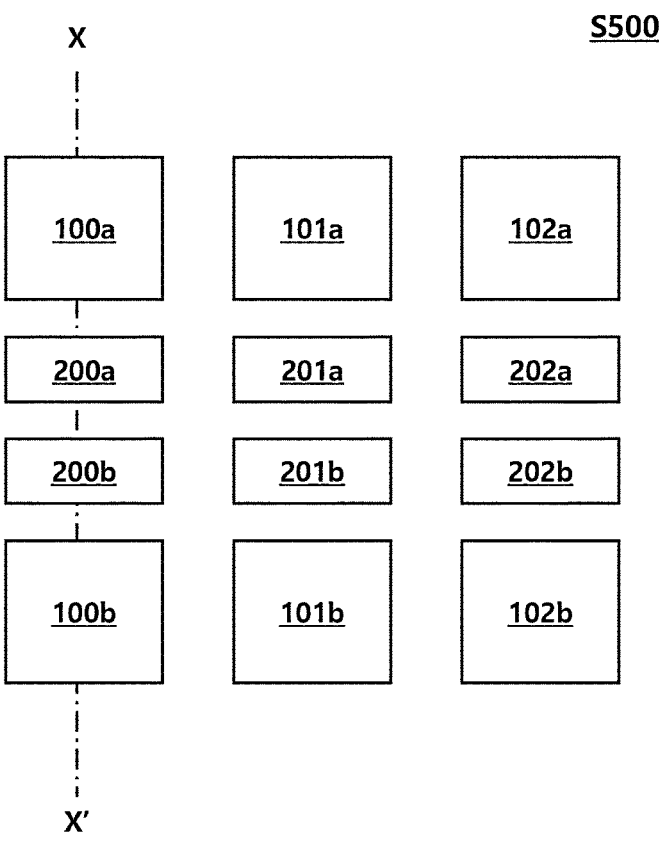
FIGS. 5A to 12 are exemplary diagrams illustrating processes of a method of manufacturing a power semiconductor module according to an embodiment.
Figure 5B:
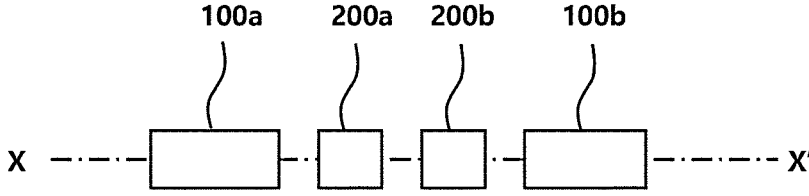

Referring to FIGS. 5A and 5B, in a first process S500, a plurality of power semiconductors dies 100*a*, 101*a*, 102*a*, 100*b*, 101*b*, 102*b*, 200*a*, 201*a*, 202*a*, 200*b*, 201*b*, and 202*b* may be disposed while forming one layer. A substrate for the process may be disposed. The plurality of power semiconductors dies 100*a*, 101*a*, 102*a*, 100*b*, 101*b*, 102*b*, 200*a*, 201*a*, 202*a*, 200*b*, 201*b*, and 202*b* may be disposed at predetermined locations on the substrate.

The power semiconductor dies 100*a*, 101*a*, 102*a*, 100*b*, 101*b*, and 102*b* having a transistor form may be disposed in a plurality of power semiconductors die. When the six power semiconductor dies 100*a*, 101*a*, 102*a*, 100*b*, 101*b*, and 102*b* having a transistor form are disposed, some power semiconductor dies 100*a*, 101*a*, and 102*a* and the remaining power semiconductor dies 100*b*, 101*b*, and 102*b* may have an upper side and a lower disposed in opposite directions.

The power semiconductor dies 200*a*, 201*a*, 202*a*, 200*b*, 201*b*, and 202*b* having a diode form may be disposed in a plurality of power semiconductors die. When six power semiconductor dies 200*a*, 201*a*, 202*a*, 200*b*, 201*b*, and 202*b* having a diode form are disposed, some power semiconductor dies 200*a*, 200*b*, and 201*b* and the remaining power semiconductor dies 201*a*, 202*a*, and 202*b* may have an upper side and a lower disposed in opposite directions.

Figure 6A:
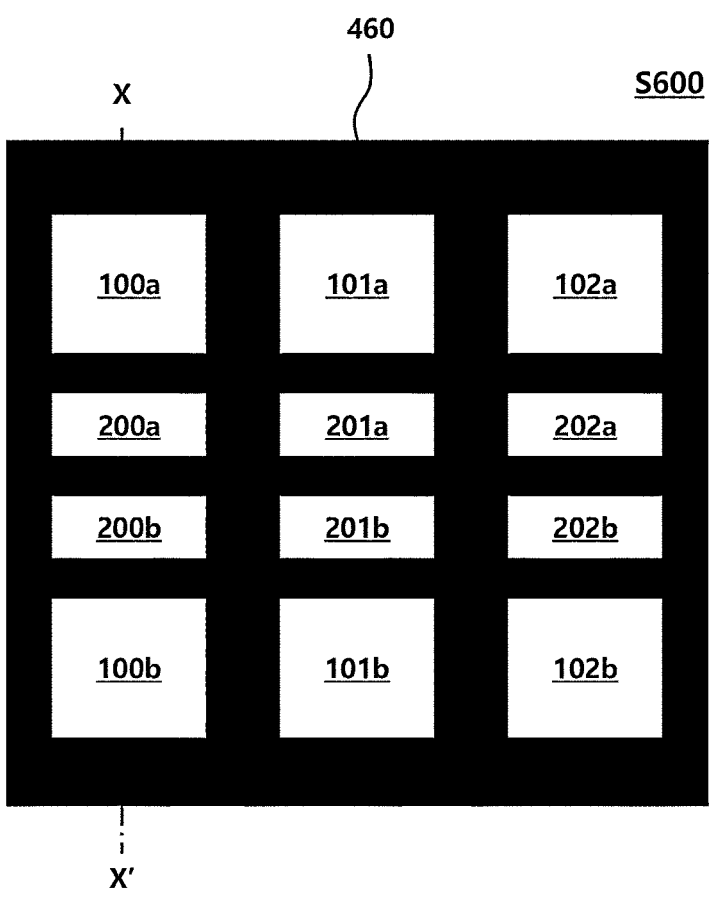
Figure 6B:
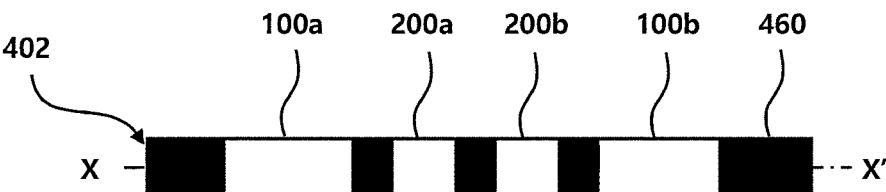

Referring to FIGS. 6A and 6B, in a second process S600, the first mold 460 that surrounds the sides of the plurality of power semiconductors dies 100*a*, 101*a*, 102*a*, 100*b*, 101*b*, 102*b*, 200*a*, 201*a*, 202*a*, 200*b*, 201*b*, and 202*b* may be formed.

In the second process S600, the upper and the lower sides of the plurality of power semiconductors dies 100*a*, 101*a*, 102*a*, 100*b*, 101*b*, 102*b*, 200*a*, 201*a*, 202*a*, 200*b*, 201*b*, and 202*b* may be exposed, and only sides thereof may be surrounded by the first mold 460. Accordingly, all the electrodes of the plurality of power semiconductors dies 100*a*, 101*a*, 102*a*, 100*b*, 101*b*, 102*b*, 200*a*, 201*a*, 202*a*, 200*b*, 201*b*, and 202*b* may be exposed. Furthermore, the locations of the plurality of power semiconductors dies 100*a*, 101*a*, 102*a*, 100*b*, 101*b*, 102*b*, 200*a*, 201*a*, 202*a*, 200*b*, 201*b*, and 202*b* may be fixed by the first mold 460.

The first mold 460 may be formed of an EMC. The first mold 460 may be formed in a form in which the EMC is injected into the surroundings of the plurality of power semiconductors dies 100*a*, 101*a*, 102*a*, 100*b*, 101*b*, 102*b*, 200*a*, 201*a*, 202*a*, 200*b*, 201*b*, and 202*b*.

The semiconductor die layer 402 that is constituted with the plurality of power semiconductors dies 100*a*, 101*a*, 102*a*, 100*b*, 101*b*, 102*b*, 200*a*, 201*a*, 202*a*, 200*b*, 201*b*, and 202*b* and the first mold 460 may be formed through the second process S600.

Figure 7A:
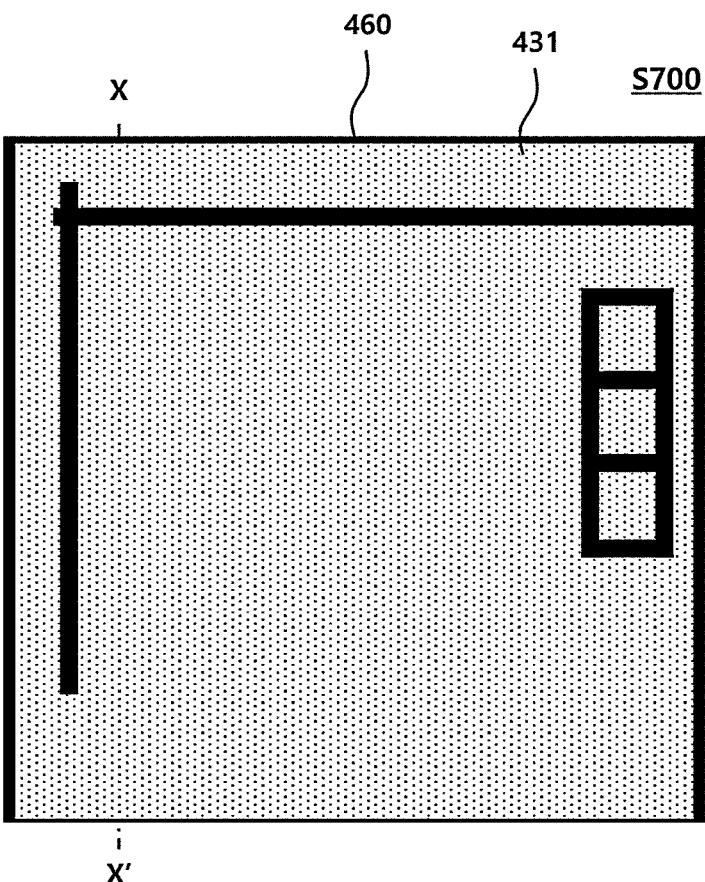
Figure 7B:
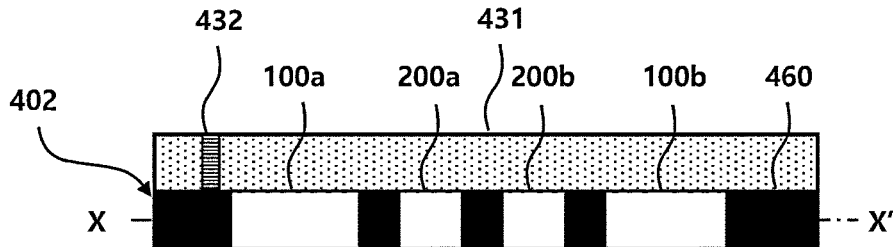

Referring to FIGS. 7A and 7B, in a third process S700, first wires 431 may be formed on the semiconductor die layer 402.

The first wires 431 may be formed through electroless plating, and may be formed of a Cu-based metal.

The first wires 431 may be formed through a re-distribution layer (RDL) process.

Wires that are insulated from each other among the first wires 431 may be physically separated from each other by the first insulating member 432. The first insulating member 432 may be constituted with a photoresist, for example.

Figure 8A:
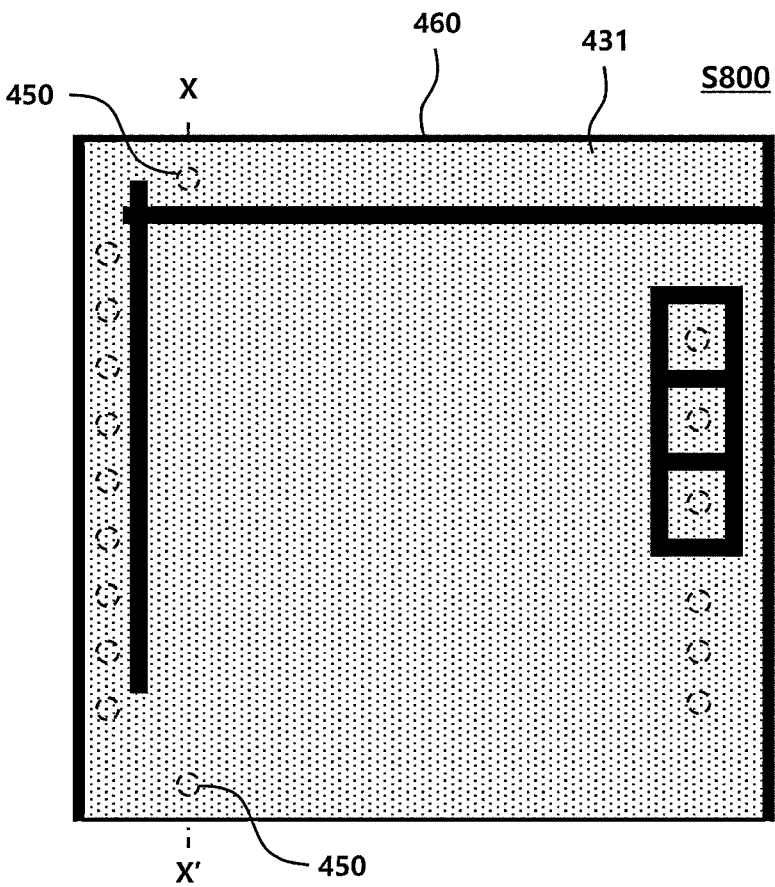
Figure 8B:
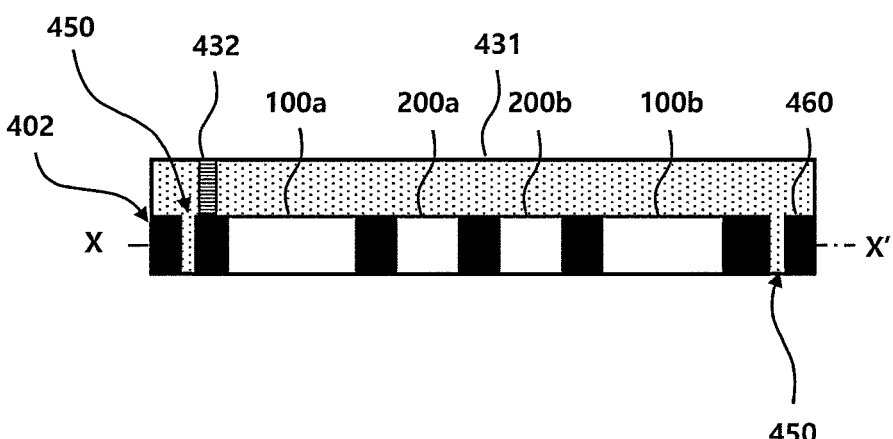

Referring to FIGS. 8A and 8B, in a fourth process S800, a hole that penetrates some of the first wires 431 and the first mold 460 may be formed. The connection wire 450 on the upper side and lower side thereof may be formed through the hole.

The connection wire 450 may electrically connect some of the second wires described later and some of the first wires 431.

Figure 9A:
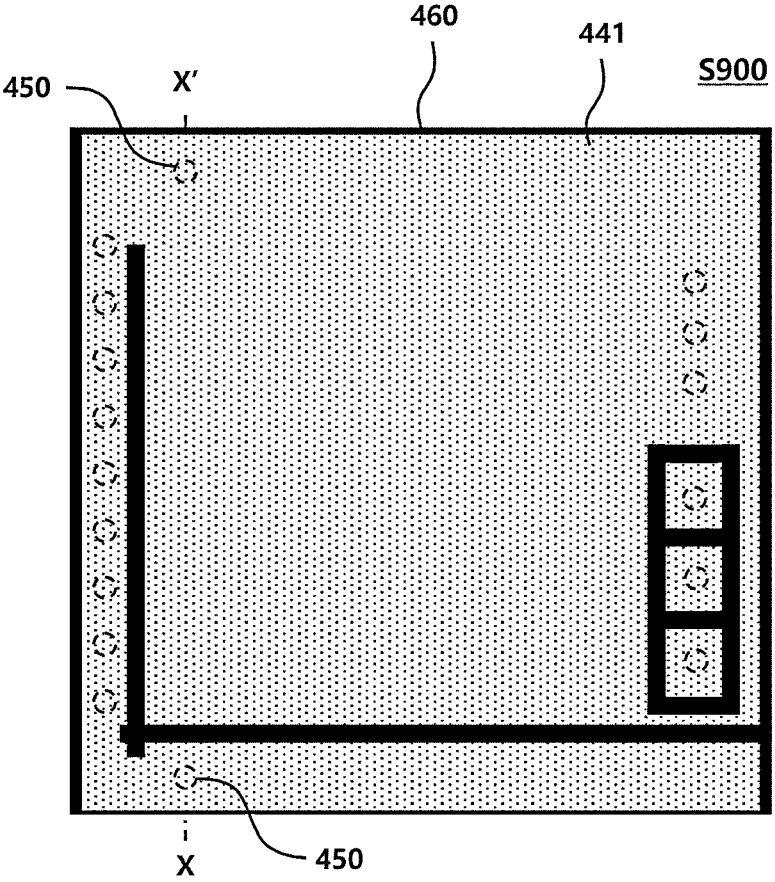
Figure 9B:
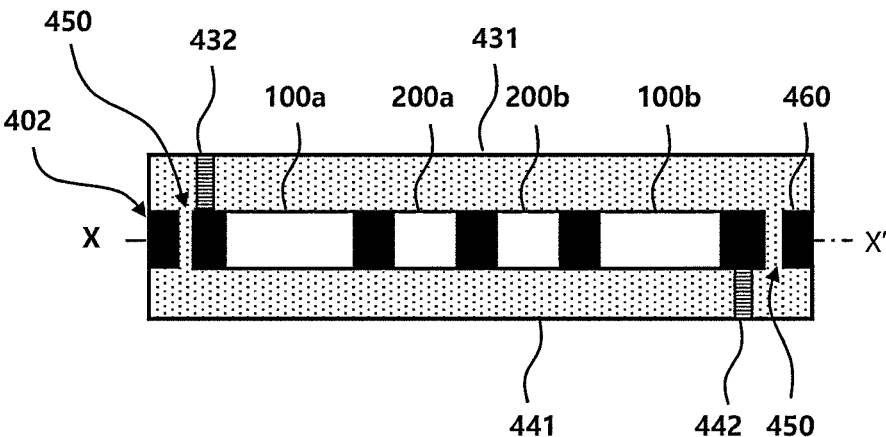

Referring to FIGS. 9A and 9B, process surfaces of the module that are in process may be turned upside down so that the process surfaces become opposite to each other. For convenience of description, FIG. 9A illustrates a bottom of the module that is in process.

In a fifth process S900, second wires 441 may be formed at the bottom of the semiconductor die layer 402.

The second wires 441 may be formed through electroless plating, and may be formed of a Cu-based metal.

The second wires 441 may be formed through a re-distribution layer (RDL) process.

Wires that are insulated from each other among the second wires 441 may be physically separated from each other by the second insulating member 442. The second insulating member 442 may be constituted with a photoresist, for example.

The fourth process described with reference to FIGS. 8A and 8B may be performed after the fifth process S900. For example, after the fifth process S900, a hole that penetrates some of the second wires 441 and the first mold 460 may be formed. The connection wire 450 on the upper side and lower side thereof may be formed through the hole. The connection wire 450 may electrically connect some of the second wires 441 and some of the first wires 431.

Figure 10A:
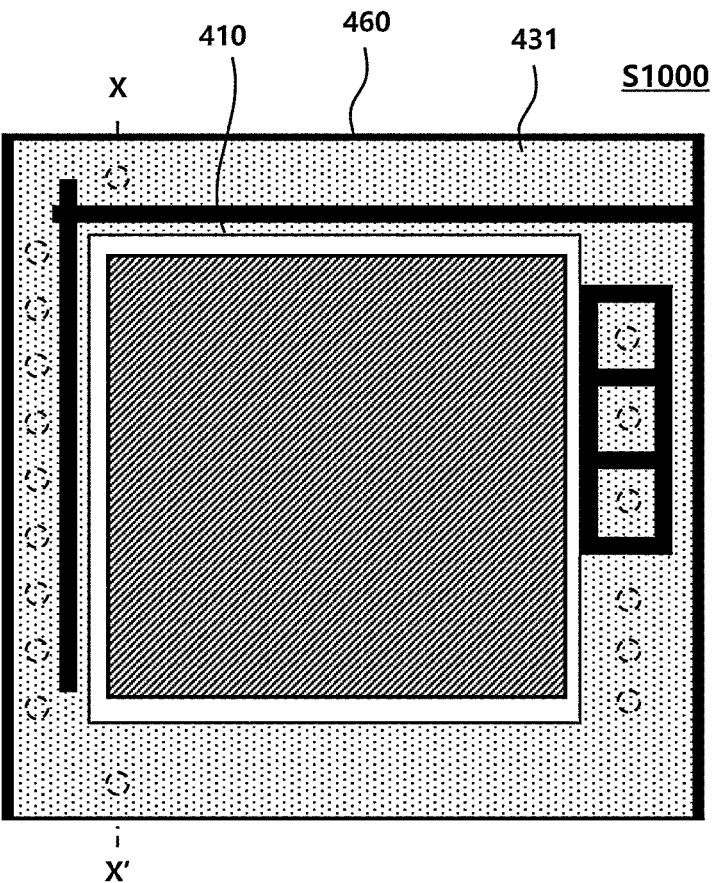
Figure 10B:
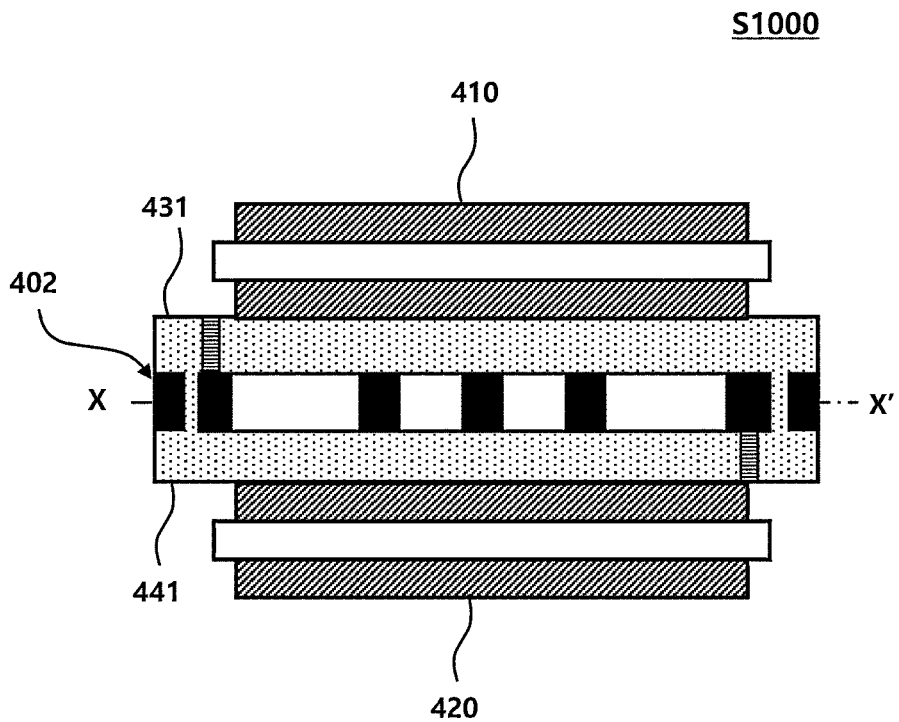

Referring to FIGS. 10A and 10B, in a sixth process S1000, the first substrate 410 that discharges heat to the upper side thereof may be disposed above the first wires 431. The second substrate 420 that discharges heat to the lower side thereof may be disposed below the second wires 441.

The first substrate 410 may be bonded to the first wires 431 through a bonding member. The bonding member may be an Sn—Ag-based bonding member or an Ag-based bonding member, for example. The first substrate 410 may be bonded to the first wires 431 through soldering or sintering.

The second substrate 420 may be bonded to the second wires 441 through a bonding member. The bonding member may be an Sn—Ag-based bonding member or an Ag-based bonding member, for example. The second substrate 420 may be bonded to the second wires 441 through soldering or sintering.

Figure 11:
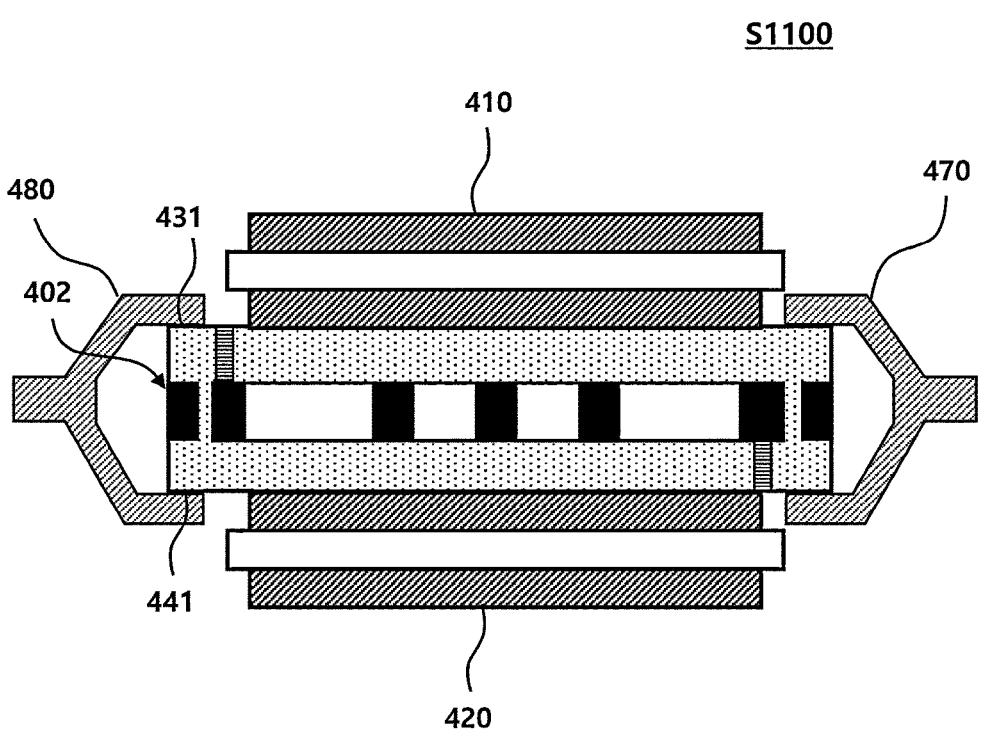

Referring to FIG. 11, in a seventh process S1100, the lead frame 470 and 480 may be disposed to come into contact with some of the first wires 431 and some of the second wires 441.

Figure 12:
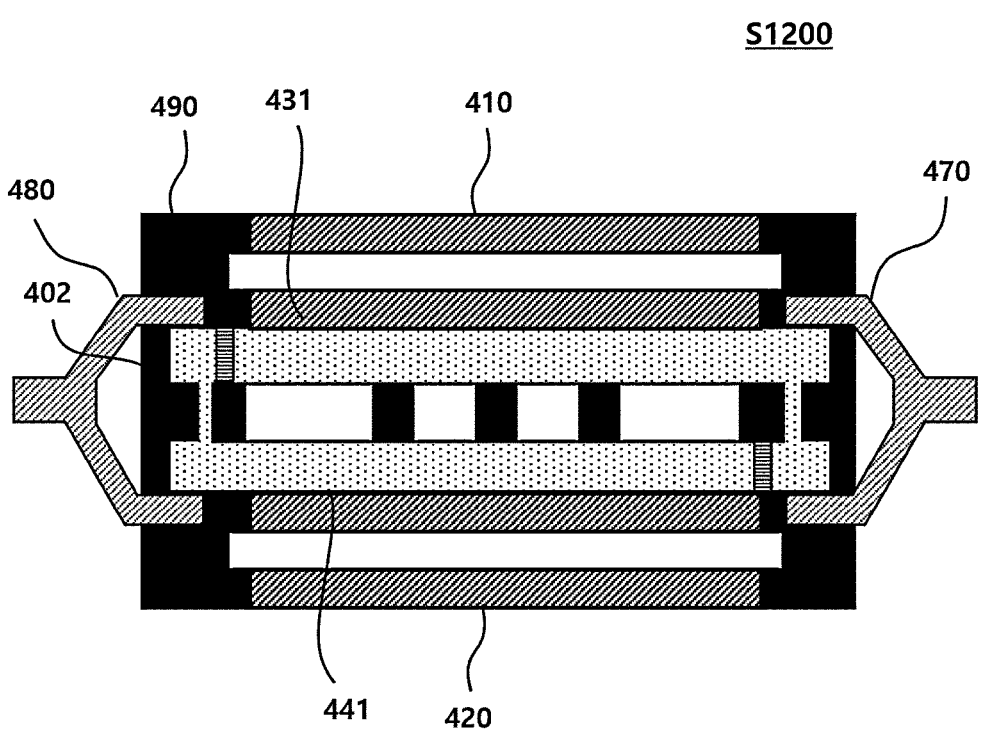

Furthermore, referring to FIG. 12, in an eighth process S1200, the second mold 490 may be formed to surround a contact part of the lead frame 470 and 480 and the first wires 431 and a contact part of the lead frame 470 and 480 and the second wires 441.

The second mold 490 may be formed of the same substance as the first mold. For example, the second mold 490 and the first mold may be formed of an EMC.

Figure 13:
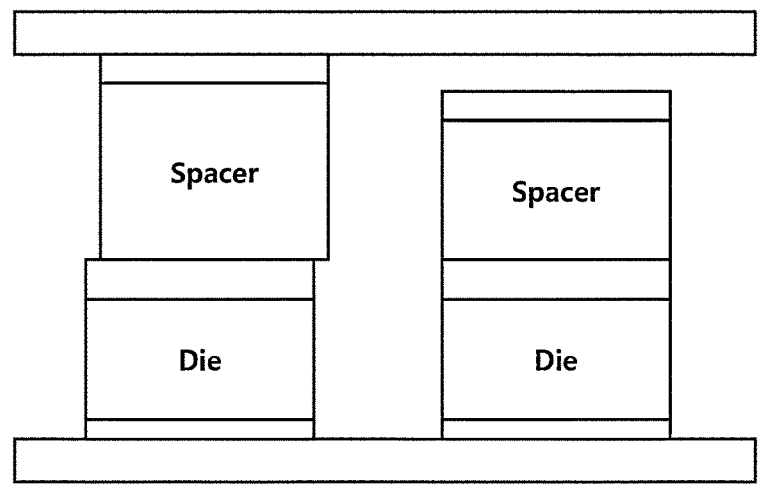
FIG. 13 is a diagram illustrating a structure in which a distance between substrates is maintained by using a spacer.

FIG. 13 is a diagram illustrating a structure in which a distance between substrates is maintained by using a spacer.

Referring to FIG. 13, a power semiconductor module may maintain a distance between an upper substrate and a lower substrate by using a spacer.

The spacer is produced through a process different from that of a power semiconductor die. Furthermore, the spacer may be bonded to the power semiconductor die through a bonding process. In such a bonding process, a miss-alignment problem may occur between the spacer and the power semiconductor die.

A deviation may occur between spacers when multiple spacers are used because the spacer is an individual component that is produced through a process different from that of the power semiconductor die. Considering that a deviation also occurs even in the power semiconductor die, the deviation between the spacers causes a generally greater deviation, and may have a problem with the flatness of the power semiconductor module as illustrated in FIG. 13. The flatness problem may be derived into an electrical connection failure problem.

The power semiconductor module according to an embodiment can improve the miss-alignment problem, the deviation problem, the flatness problem, and the electrical connection failure problem by removing the spacer and disposing wires that are formed through the RDL process at the upper and the lower sides of the power semiconductor die.

As described above, according to the present embodiment, a miss-alignment problem between components in the double-sided heat dissipation power semiconductor module can be improved. A flatness problem attributable to a height deviation between components can be improved. An adhesion failure problem between an upper substrate and a lower substrate can be improved. A low reliability problem according to forms and materials of components can be improved. Furthermore, according to the present embodiment, reliability can be enhanced because the number of junctions of heterogeneous components is reduced, and a general thickness of the power semiconductor module can be reduced because a spacer is removed. Furthermore, according to the present embodiment, material and process costs can be reduced by removing a spacer.

What is claimed is:

1. A power semiconductor module comprising:
   a semiconductor die layer in which a first power semiconductor die and a second power semiconductor die are disposed and a first mold is formed to surround lateral sides of the first power semiconductor die and the second power semiconductor die;
   a wiring layer comprising a first wire disposed on an upper surface of the semiconductor die layer and a second wire disposed on a lower surface of the semiconductor die layer; and
   a substrate layer configured to dissipate heat that is delivered from the semiconductor die layer to the wiring layer,
   wherein the wiring layer is arranged in contact with the upper and lower surfaces of the first power semiconductor die, the second power semiconductor die, and the first mold, respectively, and
   wherein a horizontal width of the wiring layer is greater than a sum of the horizontal widths of the first power semiconductor die and the second power semiconductor die.

2. The power semiconductor module of claim 1 further comprising a second mold configured to fill a surrounding space of the wiring layer, wherein the first mold and the second mold are formed of an identical substance and are formed at different times.

3. The power semiconductor module of claim 1 further comprising a second mold configured to fill a surrounding space of the wiring layer, wherein the first mold and the second mold are formed of an epoxy molding compound (EMC).

4. The power semiconductor module of claim 1, wherein:
the substrate layer comprises a first substrate disposed on one side of the wiring layer and a second substrate disposed on the other side of the wiring layer,
wherein each of the first substrate and the second substrate comprises an insulating substance layer, a heat dissipation metal layer disposed on one side of the insulating substance layer and a metal wiring layer disposed on the other side of the insulating substance layer.

5. The power semiconductor module of claim 1, wherein the wiring layer is longer than the substrate layer and the power semiconductor module further comprises a lead frame connected to a part of the wiring layer, which does not overlap with the substrate layer.

6. The power semiconductor module of claim 5, wherein the thickness of the first mold is less than the thickness of each of the first power semiconductor die and the second power semiconductor die.

7. The power semiconductor module of claim 1, wherein the first wire and the second wire are formed of a Cu-based metal.

8. The power semiconductor module of claim 1, further comprising a connection wire electrically connected at least one of the first wire and the second wire.

9. The power semiconductor module of claim 8, wherein the first mold comprises a first through hole penetrating the first mold, and
wherein the connection wire is disposed in the first through hole.

10. The power semiconductor module of claim 1, wherein the horizontal width of the wiring layer is greater than a horizontal width of the substrate layer.

11. A power semiconductor module comprising:
a semiconductor die layer in which a first power semiconductor die and a second power semiconductor die are disposed and a first mold is formed to surround sides of the first power semiconductor die and the second power semiconductor die;
a wiring layer comprising a first wire disposed on an upper surface of the semiconductor die layer and a second wire disposed on a lower surface of the semiconductor die layer, wherein at least one of the first wire and the second wire is electrically connected through a connection wire that penetrates the first mold; and
a substrate layer configured to dissipate heat that is delivered from the semiconductor die layer to the wiring layer,
wherein the wiring layer is arranged in contact with the upper and lower surfaces of the first power semiconductor die, the second power semiconductor die, and the first mold, respectively, and
wherein a horizontal width of the wiring layer is greater than a sum of the horizontal widths of the first power semiconductor die and the second power semiconductor die.

12. The power semiconductor module of claim 11, further comprising a lead frame having one side, which is in contact with the wiring layer and the other side provided as an external connection terminal.

13. The power semiconductor module of claim 12, further comprising a second mold surrounding the one side of the lead frame.

14. The power semiconductor module of claim 12, wherein the lead frame is in contact with wires that are electrically connected to the connection wire on an upper side and a lower side of the wiring layer.

15. The power semiconductor module of claim 11, wherein:
the substrate layer comprises a first substrate disposed on an upper side of the wiring layer and a second substrate disposed on a lower side of the wiring layer,
wherein each of the first substrate and the second substrate comprises an insulating substance layer formed of a ceramic substance, a heat dissipation metal layer disposed on one side of the insulating substance layer and formed of a Cu-based metal, and a metal wiring layer disposed on the other side of the insulating substance layer and formed of a Cu-based metal.

16. The power semiconductor module of claim 11, wherein the first power semiconductor die and the second power semiconductor die are metal oxide semiconductor field effect transistors (MOSFETs).

17. The power semiconductor module of claim 16, wherein a power semiconductor die in a diode form is further disposed in the semiconductor die layer.

18. The power semiconductor module of claim 11, wherein the horizontal width of the wiring layer is greater than a horizontal width of the substrate layer.

* * * * *